United States Patent
Yamada et al.

(10) Patent No.: US 11,721,778 B2
(45) Date of Patent: Aug. 8, 2023

(54) RADIATION DETECTING ELEMENT AND METHOD FOR PRODUCING RADIATION DETECTING ELEMENT

(71) Applicant: JX NIPPON MINING & METALS CORPORATION, Tokyo (JP)

(72) Inventors: Kohei Yamada, Kitaibaraki (JP); Koji Murakami, Kitaibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 68 days.

(21) Appl. No.: 16/971,716

(22) PCT Filed: Mar. 15, 2019

(86) PCT No.: PCT/JP2019/011003
§ 371 (c)(1),
(2) Date: Aug. 21, 2020

(87) PCT Pub. No.: WO2020/066070
PCT Pub. Date: Apr. 2, 2020

(65) Prior Publication Data
US 2020/0395496 A1   Dec. 17, 2020

(30) Foreign Application Priority Data
Sep. 25, 2018   (JP) ................. 2018-179342

(51) Int. Cl.
*H01L 31/08* (2006.01)
*H01L 31/0296* (2006.01)
(Continued)

(52) U.S. Cl.
CPC ........... *H01L 31/085* (2013.01); *G01T 1/241* (2013.01); *G01T 7/00* (2013.01); *H01L 31/02966* (2013.01); *H01L 31/1832* (2013.01)

(58) Field of Classification Search
CPC ............. H01L 31/085; H01L 31/02966; H01L 31/1832
See application file for complete search history.

(56) References Cited

U.S. PATENT DOCUMENTS

| 2008/0203514 A1* | 8/2008 | Szeles ................. H01L 31/1828 257/E31.058 |
| 2010/0032579 A1 | 2/2010 | Chen |

(Continued)

FOREIGN PATENT DOCUMENTS

| CN | 100412239 C | * | 8/2008 |
| CN | 102113136 A | | 6/2011 |

(Continued)

OTHER PUBLICATIONS

International Preliminary Report on Patentability, issued in PCT/JP2019/011003, dated Dec. 17, 2019.

(Continued)

*Primary Examiner* — Calvin Y Choi
(74) *Attorney, Agent, or Firm* — Birch, Stewart, Kolasch & Birch, LLP

(57) ABSTRACT

Provided is a radiation detecting element that has high adhesion between electrode portions and a substrate and does not suffer from performance failures due to insufficient insulation between the electrode portions, even if a distance between the electrode portions is narrower in order to obtain a high-definition radiation drawn image. The radiation detecting element includes: a plurality of electrode portions; and an insulating portion provided between the electrode portions on a surface of a substrate made of a compound semiconductor crystal containing cadmium telluride or cadmium zinc telluride, wherein an intermediate layer containing tellurium oxide is present between each of the electrode portions and the substrate, and wherein tellurium oxide is present on an upper portion of the insulating portion, and the (Continued)

tellurium oxide on the upper portion of the insulating portion has a maximum thickness of 30 nm or less.

12 Claims, 7 Drawing Sheets

(51) Int. Cl.
  *H01L 31/18* (2006.01)
  *G01T 1/24* (2006.01)
  *G01T 7/00* (2006.01)

(56) References Cited

U.S. PATENT DOCUMENTS

| | | | |
|---|---|---|---|
| 2014/0091228 A1 | 4/2014 | Yamakawa et al. | |
| 2015/0194459 A1* | 7/2015 | Rusian | G01T 1/161 257/428 |
| 2021/0011180 A1 | 1/2021 | Yamada et al. | |

FOREIGN PATENT DOCUMENTS

| | | |
|---|---|---|
| EP | 3 758 073 A1 | 12/2020 |
| JP | 62-120086 A | 6/1987 |
| JP | 8-125203 A | 5/1996 |
| JP | 2001-177141 A | 6/2001 |
| JP | 2003-142673 A | 5/2003 |
| JP | 2008-546177 A | 12/2008 |
| JP | 2013-503481 A | 1/2013 |
| JP | 2013-157494 A | 8/2013 |
| JP | 2014-48171 A | 3/2014 |
| JP | 2016-29380 A | 3/2016 |
| JP | 2017-162908 A | 9/2017 |
| WO | WO 2007/024302 A2 | 3/2007 |
| WO | WO 2011/025631 A2 | 3/2011 |

OTHER PUBLICATIONS

International Search Report, issued in PCT/JP2019/011003, dated Jun. 11, 2019.

English translation of the International Preliminary Report on Patentability (forms PCT/IPEA/409 and PCT/IB/338), dated Mar. 25, 2021, for corresponding International Application No. PCT/JP2019/011003.

Extended European Search Report for corresponding European Application No. 19865841.1, dated Aug. 31, 2021.

Chinese Office Action and Search Report for corresponding Chinese Application No. 201980005599.9, dated Jan. 20, 2023.

* cited by examiner

RADIATION DETECTING ELEMENT AND METHOD FOR PRODUCING RADIATION DETECTING ELEMENT

FIELD OF THE INVENTION

The present invention relates to a radiation detecting element using a compound semiconductor crystal containing cadmium telluride (CdTe) or cadmium zinc telluride (CdZnTe), and a method for producing the radiation detecting element.

BACKGROUND OF THE INVENTION

A crystalline material of cadmium telluride (CdTe), which is a Group II-VII compound of cadmium (Cd), a Group II (Group 2B) element, and tellurium (Te), a Group VI (Group 6B) element, is a crystalline compound semiconductor material with a relatively large band gap (~1.44 eV). Further, CdTe-based compound semiconductor crystal materials, including zinc cadmium telluride (CdZnTe) having a further increased band gap by replacing a part of Cd of CdTe with Zn as a homologous element, are suitably used in wide variety applications such as optical elements of solar cells, electro-optical modulators and infrared windows, and radiation detectors such as infrared detectors such as dark-field cameras and infrared telescopes, and radiation detectors such as X-ray photographs, X-ray computer tomography (CT), and environmental radiation measuring instruments.

Among them, in the radiation detector application, it is possible to electrically detect the radiation by applying a high bias voltage to an insulating CdTe-based crystal having a high resistivity, and converting incidence of the radiation into a current signal by a (internal) photoelectric effect generated when the radiation is incident upon the crystal material. That is, the radiation detecting element that will be a main part for detecting the radiation in the radiation detector is composed of at least a CdTe-based crystal material and an electrode portion for applying a high bias voltage to the crystal material.

If the radiation detecting element is formed such that a plurality of electrode portions are arranged at different positions on the surface of the CdTe crystal, the radiation can be detected according to the positions of the electrode portions. Arrangement of a plurality of electrode portions in the form of a matrix using it can provide a radiation image corresponding to a pixel in which each electrode portion detects the radiation. An X-ray photograph or an X-ray CT is to obtain a drawn image of X-ray, which is a kind of radiation, by applying the above principle. With regard to such a radiation detecting element, techniques and the like disclosed in Patent literatures 1 to 3 are known in the art.

The radiation detecting element in which a plurality of electrode portions are arranged at different positions on the CdTe-based crystal is produced by arranging the plurality of electrode portions at predetermined intervals on a surface of a substrate made of a semiconductor crystal containing the CdTe-based compound. In this regard, Patent Literature 1 forms thin films that will be electrode portions, by masking portions corresponding to spaces between a plurality of electrode portions on a substrate surface with a resist film or the like, and in this state, immersing the substrate in a plating solution to plate unmasked portions on the substrate surface to form conducting layers on the unmasked portions. For a means for forming the electrode portions, there is a conventional technique using an evaporation method instead of the plating method as in Patent Document 4. After the formation of the electrode portions, the masking material such as the resist film is removed.

Patent Literature 1 forms an intermediate layer containing a Te oxide having a resistivity of $10^7$ Ω·cm or less between the formed electrode portion and a substrate surface by carrying out a plating treatment using a specific plating solution under specific conditions when forming the electrode portion by the above method. The presence of the intermediate layer can lead to significant improvement of adhesion between the surface of the substrate made of the crystalline material containing the CdTe-based compound and the thin-film electrode material to be formed.

The technique disclosed in Patent Literature 1 is very useful for obtaining the radiation detecting element having high adhesion between the substrate and the electrode layer, high durability, and long life. As a recent technological trend, there has been an increasing need for high definition of drawn images of the radiation detecting element, and a distance between the electrodes has been reduced in addition to areas of individual electrodes accordingly. In order to reliably separate electrical signals from the respective electrode portions to obtain a high-definition image, it is important to ensure that the electrode portions are insulated even if the distance between the electrode portions is reduced and narrowed. Therefore, a material between the electrode portions, i.e., a substrate itself made of a crystalline material containing a CdTe-based compound should have a sufficiently high resistivity.

However, it is observed that only controlling of the resistance value of the substrate is insufficient for insulation, and an element performance defect (e.g., leakage current between the electrodes) caused by inadequate insulation between the electrodes is generated, especially when producing radiation detecting element having a narrower distance between the electrodes. The element having such a defect cannot appropriately separate the detection signals of the radiation according to the position of each electrode portion, resulting in evens where the spatial resolution is reduced to blur a drawn image, and in some cases, a function as a radiation detecting element cannot be achieved, and the like.

CITATION LIST

Patent Literatures

[Patent Literature 1] Japanese Patent Application Publication No. 2013-157494 A
[Patent Literature 2] Japanese Patent Application Publication No. 2013-503481 A
[Patent Literature 3] Japanese Patent Application Publication No. 2003-142673 A
[Patent Literature 4] Japanese Patent Application Publication No. H08-125203 A

SUMMARY OF THE INVENTION

The present disclosure is intended to solve the above problems. An object of the present invention is to provide a radiation detecting element having higher adhesion between electrodes and a substrate and a reduced element defect caused by leakage current between the electrodes.

As a result of intensive studies to solve the above problems, the present inventors have found that when the insulating portion (upper portion) between the electrode portions is masked with a resist and the substrate is then immersed in a plating solution to form a thin film that will be the electrode portion, the plating solution penetrates between the upper portion of the insulating portion and the resist to form an oxide having relatively poor insulation on the upper portion of the insulating portion. As a result, the present inventors have found that a current as a leakage path flows through the oxide, thereby generating element defects. Therefore, the present inventors also found that improved adhesion between the upper portion of the insulating portion and the resist prevents the penetration of the plating solution and suppresses the formation of the oxide, thereby reducing the element defects caused by leakage current, and they have completed the present invention.

Based on the findings as described above, the present disclosure provides the following invention:

1) A radiation detecting element, comprising: a plurality of electrode portions; and an insulating portion provided between the electrode portions on a surface of a substrate made of a compound semiconductor crystal containing cadmium telluride or cadmium zinc telluride, wherein an intermediate layer containing tellurium oxide is present between each of the electrode portions and the substrate, and wherein tellurium oxide is present on an upper portion of the insulating portion, and the tellurium oxide on the upper portion of the insulating portion has a maximum thickness of 30 nm or less.
2) The radiation detecting element according to 1), wherein the tellurium oxide on the upper portion of the insulating portion has a maximum thickness of 20 nm or less.
3) The radiation detecting element according to 2), wherein the maximum thickness of the tellurium oxide on the upper portion of the insulating portion is 10 nm or less.
4) The radiation detecting element according to any one of 1) to 3), wherein the tellurium oxide on the upper portion of the insulating portion is present in an island shape.
5) The radiation detecting element according to any one of 1) to 4), wherein the intermediate layer has an average thickness of 100 nm or more.
6) The radiation detecting element according to 5), wherein the average thickness of the intermediate layer is 200 nm or more.
7) The radiation detecting element according to 6), wherein the average thickness of the intermediate layer is 400 nm or more.
8) The radiation detecting element according to any one of 1) to 7), wherein the insulating portion provided between the electrode portions has a width of 100 μm or less.
9) The radiation detecting element according to any one of 1) to 8), wherein the insulating portion provided between the electrode portions is the compound semiconductor crystal containing cadmium telluride or cadmium zinc telluride.
10) The radiation detecting element according to any one of 1) to 9), wherein the electrode portions are formed of a thin film containing platinum, gold, or an alloy containing at least one of platinum and gold.
11) The radiation detection element according to any one of 1) to 10), wherein in a cross section perpendicular to the surface of the substrate, each of the electrode portions has a concave shape, and the insulating portion provided between the electrode portions has a convex shape.
12) The radiation detecting element according to any one of 1) to 11), wherein when the compound semiconductor crystal is a cadmium zinc telluride crystal ($Cd_{1-x}Zn_x Te$), it is a cadmium zinc telluride crystal having a concentration x of zinc in a Group II element of 2 at % or more and 10 at % or less, and wherein the at % means an atomic percentage composition.
13) The radiation detecting element according to any one of 1) to 12), wherein the surface of the substrate made of the compound semiconductor crystal has an orientation plane which is {111}, {110}, or {100}.
14) A method for producing the radiation detecting element according to any one of 1) to 13), the method comprising the steps of: processing a substrate into a wafer shape by cutting out the substrate from a compound semiconductor crystal ingot containing cadmium telluride or zinc cadmium telluride, polishing and washing it; forming a resist film patterned into a predetermined shape on a surface of the wafer-shaped substrate, the resist film being formed in a region other than regions where the electrode portions are to be formed; etching the regions where the electrode portions are to be formed; and forming electrode portions on the surface of the substrate in the region where the electrode portions are to be formed, by immersing the etched substrate in an electroless plating solution.

According to the present disclosure, it is possible to provide a radiation detecting element that has higher adhesion between electrode portions and a substrate, can prevent generation of any element performance defect caused by leakage current generated by insulation failure, and has high-definition and high performance, in a radiation detector using a CdTe-based compound semiconductor crystal such as CdTe or CdZnTe. It is also possible to reduce a defective product rate of the element to improve a yield for element production.

DETAILED DESCRIPTION OF THE INVENTION

Figure 1:
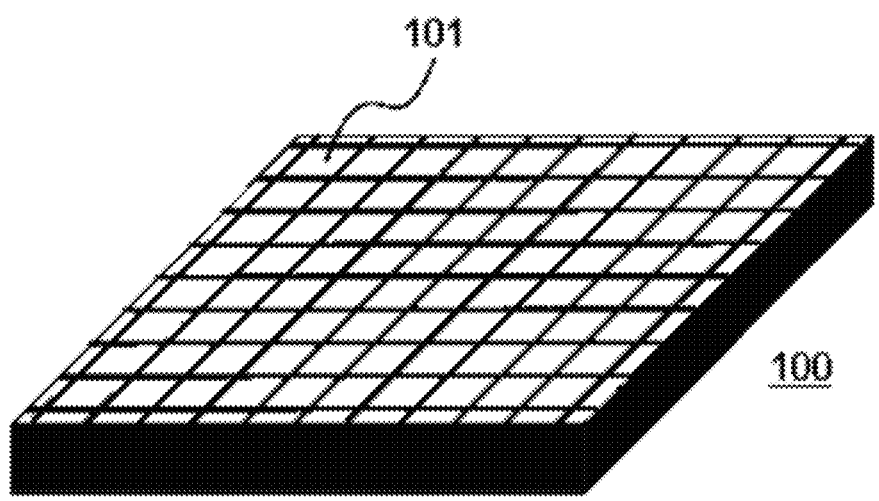
FIG. 1 is an external view of a radiation detecting element.

Conventionally, a compound semiconductor substrate containing CdTe or CdZnTe is produced by cutting out a CdTe or CdZnTe ingot and polishing its surface, and the like. The ingot is then subjected to an acidic etching treatment in order to remove a damaged layer on the substrate surface, generated due to the cutting and polishing. However, owing to the acid etching treatment, oxidation reaction at a boundary between the resist film for masking and the substrate may easily proceed in an electroless plating treatment which is a subsequent step.

That is, it has been found that after the above acidic etching treatment, a portion corresponding to the insulating portion on the substrate surface is masked with the resist film or the like, and the substrate in that state is immersed in an electroless plating solution to form electrode portions on non-masked portions on the substrate surface by electroless plating, so that adhesion between the resist film and the substrate is lower near a boundary between the resist film for masking and the insulating portion, and the electroless plating solution penetrates between the resist film and the substrate, and plating reaction for substituting Pt atoms contained in the solution with Cd atoms in the substrate proceeds, thereby forming an oxide having relatively poor insulating properties.

On the other hand, it has been found that when in a processing step of the substrate, the electroless plating is carried out through the step of cutting out the substrate into the wafer shape from a single crystal ingot, the polishing step of the wafer surface and a washing step, without the acidic etching treatment for removing the damaged layer, the penetration of the plating solution between the resist film and the substrate (the portion corresponding to the insulating portion) is suppressed without decreasing the adhesion between the resist film and the substrate, so that oxides are difficult to be formed, and the insulation failure between the electrode portions can be reduced.

Further, if the acid etching is not carried out in the step of processing the substrate, the damaged layer remains on the wafer surface, so that a risk of deterioration of the radiation element properties is concerned. However, in the present invention, prior to formation of the electrode portions by the plating, the damaged layer is removed by etching in an exposed portion on the substrate surface, which corresponds to the regions where the electrode portions are to be formed in the masking step. Therefore, there is no deterioration of electrical characteristics between the electrode portion and the substrate, whereby it is possible to avoid the risk of deterioration of the element due to the omission of the acidic etching in the processing step.

The radiation detecting element according to the present disclosure includes: multiple, i.e., at least two or more electrode portions on a surface of a substrate made of a compound semiconductor crystal containing CdTe or CdZnTe; and at least one insulating portion between the electrode portions.

Preferably, a material used as the substrate is a crystalline material containing CdTe or CdZnTe in which Cd of CdTe is partially substituted with Zn, and is a single crystal material. The crystalline material containing CdTe or CdZnTe as a substrate may further contain a dopant element(s) such as indium (In) and chlorine (Cl).

FIG. 1 shows an example of the entire appearance of a radiation detecting element 100 according to the present disclosure. In the example shown in this figure, a plurality of electrode portions 101 provided on a surface of a substrate are arranged in the form of matrix in a vertical direction and in a crosswise direction orthogonal to the vertical direction. However, the radiation detecting element according to the present disclosure is not limited to such a specific embodiment. As described above, radiation detecting elements in which at least two or more electrode portions are provided on the surface of the substrate and there is a region where no electrode portion is present between the electrode portions will be encompassed in the scope of the present disclosure.

Figure 2:
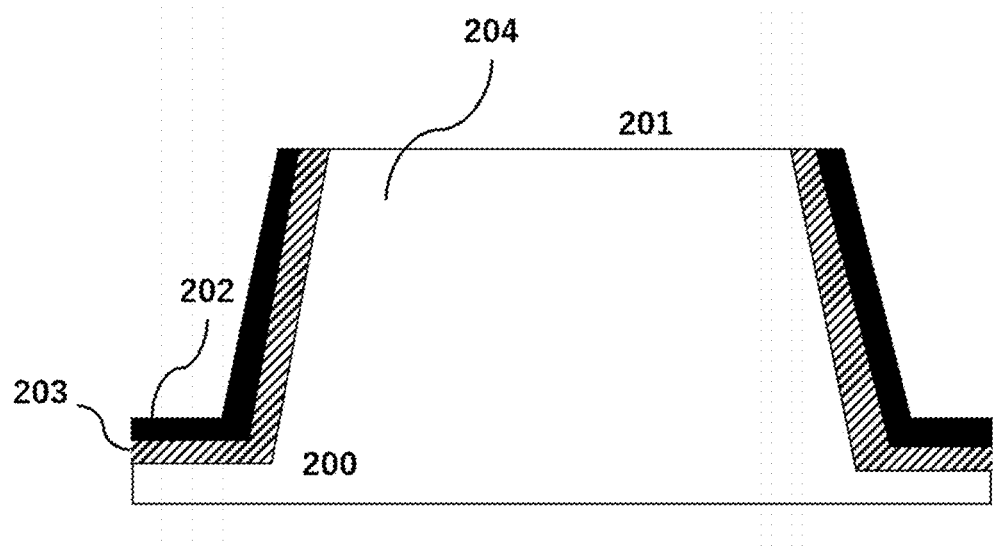
FIG. 2 is an enlarged cross-sectional view of a radiation detecting element.

FIG. 2 schematically shows an enlarged cross-sectional view of the vicinity of the electrode portion 101 and an insulating portion 201 in FIG. 1. Between two adjacent electrode portions 202 on the surface of the substrate 200 is the insulating portion 201 having higher resistivity. Each of the electrode portions 202 is separated by the insulating portion 201 to define a spatial radiation detection region for each electrode portion. Therefore, the insulating portion 201 between the electrode portions 202 should have a sufficiently high resistivity such that a current path does not occur between the adjacent electrode portions 202, which can be, for example, $10^7$ $\Omega \cdot cm$ or more. In FIG. 2, the surface of each electrode portion 202 is formed at a position lower than the surface of the insulating portion 201 between the electrode portions 202, although not limited thereto. Both may be in the same plane, or the surface of each electrode portion 202 may be formed at a position higher than the surface of the insulating portion 201 between the electrode portions 202.

Between the electrode portion 202 and the surface of the substrate 200 is an intermediate layer 203 containing an oxide of Te. The oxide of Te is a conductive oxide having an atomic ratio of oxygen (O) to Te (O/Te) in a range of approximately 0.6 to 1. Therefore, electrical charges in the semiconductor can also reach the electrode portions through the oxide. The intermediate layer 203 containing the oxide of Te is interposed between the surface of the substrate made of the compound semiconductor crystal containing CdTe or CdZnTe and the electrode material, thereby producing an effect of improving the adhesion of the electrode portions. An average thickness of the intermediate layer 203 is in a range where the effect of improving the adhesion of the electrode portions is produced, and is preferably 100 nm or more, and more preferably 200 nm or more, and further preferably 300 nm or more, and even more preferably 400 nm or more.

A Te oxide 204 is also present on a surface of an end portion of the insulating portion 201 adjacent to the electrode portion 202 such that the intermediate layer 203 extends. However, what is particularly important in the present disclosure is that the maximum thickness of the Te oxide in an upper portion of the insulating portion 201 between the electrode portions 202 is 30 nm or less, and preferably 20 nm or less, and more preferably 10 nm or less. The control of the maximum thickness of the Te oxide in the upper portion of the insulating portion 201 between the electrode portions 202 to 30 nm or less can suppress the formation of a leakage path of a current in the insulating portion 201 between the electrode portions 202 to reduce element failures due to leakage current. Further, the Te oxide may be present in an island shape in the upper portion of the insulating portion 201 between the electrode portions 202, i.e., there may be regions where the Te oxide is not partially present in the upper portion of the insulating portion 201 between the electrode portions 202. The presence of such regions where the tellurium oxide is not partially present can suppress the formation of a leakage path of a current in the insulating portion 201 between the electrode portions 202 to reduce the element failures due to leakage current.

The present disclosure is effectively applied to the radiation detection element in which the insulating portion 201 provided between the electrode portions 202 has a width of 100 μm or less. As the width of the insulating portion 201 provided between the electrode portions 202 is decreased, the leakage path of the current is easily formed in the insulating portion 201. However, by applying the technique of the present disclosure, such an adverse effect can be eliminated. The width of the insulating portion 201 provided between the electrode sections 202 is defined as the shortest linear distance from one end of the insulating portion 201 on a side of the electrode portion 202 to the other end of the insulating section 201 on a side of the electrode portion 202. The width of the insulating portion 201 between the electrode portions 202 may be 70 μm or less, or 50 μm or less.

The insulating portion 201 provided between the electrode portions 202 can be made of a compound semiconductor crystal containing CdTe or CdZnTe. In particular, a structure is preferable in which the insulating portion 201 is configured in such a form that a part of the insulating ($10^7$ Ω·cm or more) compound semiconductor crystal material containing CdTe or CdZnTe that forms the substrate 200 is partially exposed on the surface of the substrate 200 such that the compound semiconductor crystal material separates the two electrode portions 202 between the adjacent electrode portions 202, although not limited thereto. It may be a structure in which the insulating portion 201 provided between the electrode portions 202 is formed such that the insulating portion 201 is made of an insulating material different from the substrate 200.

The structure and shape of each electrode portion 202 are not particularly limited. Each electrode portion 202 may be formed according to a desired design. However, considering the viewpoint of the element forming process, miniaturization of the element, and the ease of handling, the electrode portions 202 can be provided on the substrate 200 in a form of a thin film. Further, in view of the adhesion to the Te oxide formed on the surface of the substrate 200, the electrode portions 202 can be made of a metal material, especially including platinum (Pt), gold (Au), or an alloy material containing at least one of Pt and Au, as an option for such a metal material.

The insulating portion 201 provided between the electrode portions 202 can be formed into a structure in which the insulating portion 201 is configured to be partially exposed on the surface of the substrate 200 so as to separate the two electrode portions 202 between the adjacent electrode portions 202, as discussed above. In addition, the electrode portions 202 may be configured such that they are located at a position lower than the surface of the insulating portion 201 between the electrode portion 202 and the adjacent insulating portion 201 so that each electrode portion 202 has a concave shape and each insulating section has a convex shape in a cross section perpendicular to the surface of the substrate 200.

The compound material making up the substrate 200 can be a CdZnTe crystal (cadmium zinc telluride crystal ($Cd_{1-x}Zn_xTe$)) having a concentration x of zinc in the Group II element of 2 at % or more and 10 at % or less. The Zn concentration in such a range can allow the CdTe-based semiconductor crystalline material to be controlled to a suitable bandgap for use as the radiation detector, and can also improve the insulating properties to form an element with less leakage current. The concentration x of zinc in the Group II element in the CdZnTe crystal may be 3 at % or more, or 5 at % or more, and 9 at % or less, or 7 at % or less.

A plane orientation on the surface of the substrate 200 made of the compound semiconductor crystal can be any orientation depending on crystal characteristics and/or required radiation detection performance. It may be any orientation plane of {111}, {110}, or {100}.

The above radiation detecting element may be produced by any producing method regardless of its content as long as it includes means that can obtain the above features. Hereinafter, an example of producing methods capable of effectively obtaining the structure and structural characteristics of the above radiation detecting element will be described, but the present invention is not limited thereto.

Figure 3:
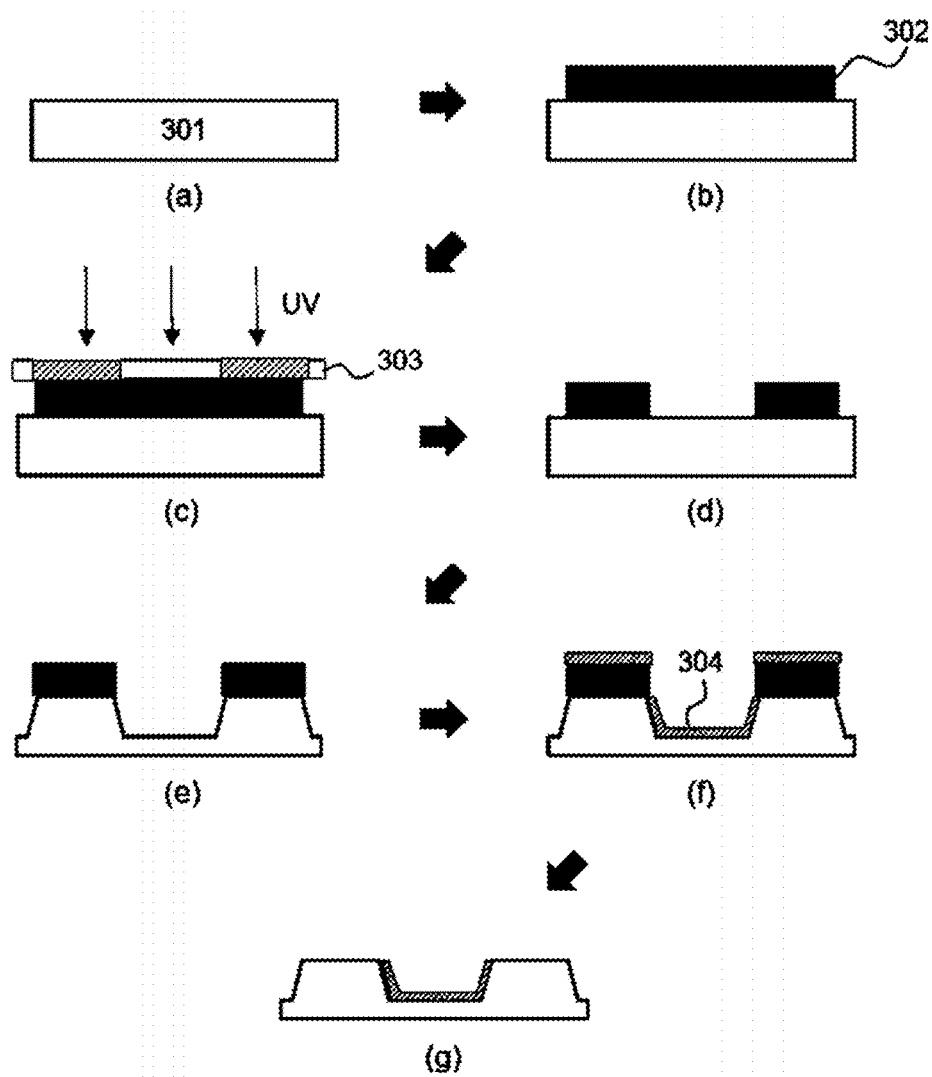
FIG. 3 is an example of production steps for a radiation detecting element.

FIG. 3 schematically illustrates steps of an example of the methods for producing the radiation detecting element according to the present disclosure. In the method of the example, first, a substrate 301 made of a compound semiconductor crystal containing CdTe or CdZnTe is prepared ((a) in FIG. 3). The substrate is cut out from a compound semiconductor crystal ingot into a wafer shape, and subjected to surface polishing, followed by a washing treatment with an alcohol or the like over the entire substrate surface as a pretreatment for electroless plating (removal of the damaged layer with the acid etching of the prior art is not carried out). To the entire surface of the substrate is applied a resist film 302 having a role of protecting the substrate surface from an etching solution in a later etching step by means of a coating method or the like ((b) in FIG. 3).

Subsequently, for the resist film formed on the entire surface of the substrate, portions corresponding to the electrode portions (the regions where the electrode portions are to be formed) are removed, leaving only a portion (pattern) in the region corresponding to the insulating portion between the electrode portions remains. In this case, the above operations can be efficiently carried out by removing exposed portions with lithograph using a photomask 303 having a pattern such that only the electrode portions are exposed, using the resist film as a photosensitive material ((c) in FIG. 3). Then, the resist film is formed only on the portion of the substrate surface, which corresponds to the insulating portion between the electrode portions ((d) in FIG. 3). Thus, on the substrate surface, the resist film patterned into a predetermined shape can be provided in the regions other than the regions where the electrode portions are to be formed.

The portions where the resist film has been removed and the surface of the substrate is exposed, that is, the regions where the electrode portions are to be formed, are etched by immersing the substrate in an etching solution. As a result, the surface of the substrate where the resist film is not present is etched into a concave shape, and the portion where the resist film is present remains as a convex shape ((e) in FIG. 3). The substrate in this state is then immersed in a plating solution to form plated films 304 on the surface of the substrate where the resist film is not present, by means of a plating method ((f) in FIG. 3). The films of the concave portions will be the electrode portions.

In this case, plating conditions such as a plating time as well as concentrations of other components contained in the plating solution and a solution temperature can be adjusted to appropriate ranges to control a thickness of the plated film and/or a thickness of the intermediate layer containing the Te oxide, formed between the plated film and the substrate surface.

The plating solution to be used may contain, in addition to the components for depositing the electrode material to be formed by plating, 10 ml/L to 30 ml/L of hydrochloric acid (HCl) having a concentration of 35%. It is believed that when a film that will be an electrode is formed by the plating method, a region where Te is excessive is generated in a reaction field between CdTe or CdZnTe of the substrate and the electrode material, and when HCl is present therein, the incorporation of oxygen present in the plating solution is facilitated to form the Te oxide.

Here, it is considered that it is effective to reduce the electroless plating time in order to suppress the formation of the Te oxide below the resist film on the insulating portion. However, any excessively reduced plating time leads to a thinner thickness of the Te oxide present between the electrode portion and the substrate, thereby causing a problem of separation of the electrode portions. Therefore, the plating time is preferably 9 minutes or more and 11 minutes or less.

As the electrode portions (and the intermediate layers containing the Te oxide) are formed by the above method, a Te oxide layer is formed on a side wall portion of the insulating portion between the electrode portions. On the other hand, the Te oxide is difficult to be formed on the upper portion of the insulating portion, which has been in contact with the resist film. This is because the adhesion between the resist film and the upper surface of the insulating portion has been improved, thereby preventing Pt atoms which are electrode materials from penetrating, and preventing the plating reaction field from being generated. If the plating solution penetrates between the resist film and the upper surface of the insulating portion to form the Te oxide, it would be isotropically formed from the penetration point.

The formation of the electrode portions is not necessarily performed by the above plating method, and may be performed by other known methods including a dry method such as a vacuum evaporation method, a sputtering method, and a chemical vapor deposition (CVD) method. However, in that case, the step of forming the intermediate layer containing the conductive Te oxide between the electrode material and the surface of the substrate should be separately performed before forming the electrode portions. In this case, the thickness of the Te oxide at the end of the insulating portion can also be controlled by appropriately adjusting conditions according to the applied processing means.

The resist film remaining on the surface of the insulating portion between the electrode portions can be then removed (lifted off) to provide a basic structure ((g) in FIG. 3) of the radiation detecting element according to the present disclosure. It should be noted that any step may be added; for example, prior to removal of the resist film, under bump metal (UBM) layers may be formed on the surfaces of the electrode portions, or after removal of the resist film, packaging as a final element may be carried out by a passivation treatment or the like.

EXAMPLES

Hereinafter, the technical contents of the present disclosure will be specifically described based on Example and Comparative Example. The descriptions of the following Example and Comparative Example are merely specific examples for facilitating the understanding of the technical contents of the present disclosure, and the technical scope of the present invention is not limited by these specific examples.

Example 1

A CdZnTe single crystal ingot was grown by VGF (Vertical Gradient Freeze) method and subjected to cylindrical grinding, and a plate-shaped circular substrate was cut out from the single crystal ingot, and a peripheral edge of the substrate was chamfered and surface-polished to prepare a substrate made of CdZnTe single crystal (having a concentration of Zn in the Group II element of 3 at %) and having surface of a (111) plane. The substrate was washed with an organic solvent (acetone) and dried. UV lithography was carried out by coating a photoresist on the surface of the substrate and drying it, and then exposing the photoresist film on an ultraviolet ray (UV) via a photomask having patterns with portions corresponding to the electrode portions being translucent and a portion corresponding the insulating portion between the electrode portions being shading, and developing the exposed portions and removing them to pattern the photoresist film. In this example, the size of each electrode portion was 0.2 mm×0.3 mm, and the width of the portion corresponding to the insulating portion between the electrode portions was 40 μm.

Subsequently, the substrate having the patterned photoresist film on the surface was immersed in an etching solution composed of 300 ml of hydrobromic acid (HBr), 6 ml of bromine (Br), and 300 ml of water to etch portions of the substrate surface where CdZnTe was exposed, that is, the portions where the electrode portions are to be formed, and remove damaged portions (crystal strain) remaining on the substrate surface. The substrates was washed and dried again, and the substrate was then immersed in a plating solution obtained by mixing 20 ml of 35% hydrochloric acid (HCl) with 1 g of chloroplatinic acid (IV) hexahydrate ($H_2PtCl_6 \cdot 6H_2O$) and 1.2 L of pure water (35% HCl concentration is nearly equal to 16.4 ml/L) at 50° C. for 10 minutes to form electrode portions composed of a Pt plated film.

Figure 4:
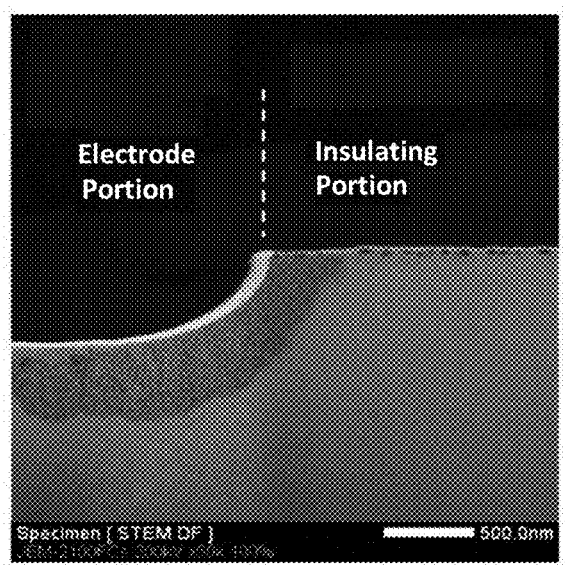
FIG. 4 is an enlarged cross-sectional image of a radiation detection element of Example 1.

After the formation of the electrode portions, the photoresist was removed, and the substrate was washed and dried. A cross-sectional structure of the element obtained in this example was observed by scanning transmission electron microscope (STEM). FIG. 4 shows an enlarged cross-sectional image by the STEM. An enlarged image confirmed that Pt electrode layers were formed on surfaces of the electrode portions, which were concave portions of the CdZnTe substrate etched into a concave shape, via the intermediate layers containing Te oxide.

Figure 5:
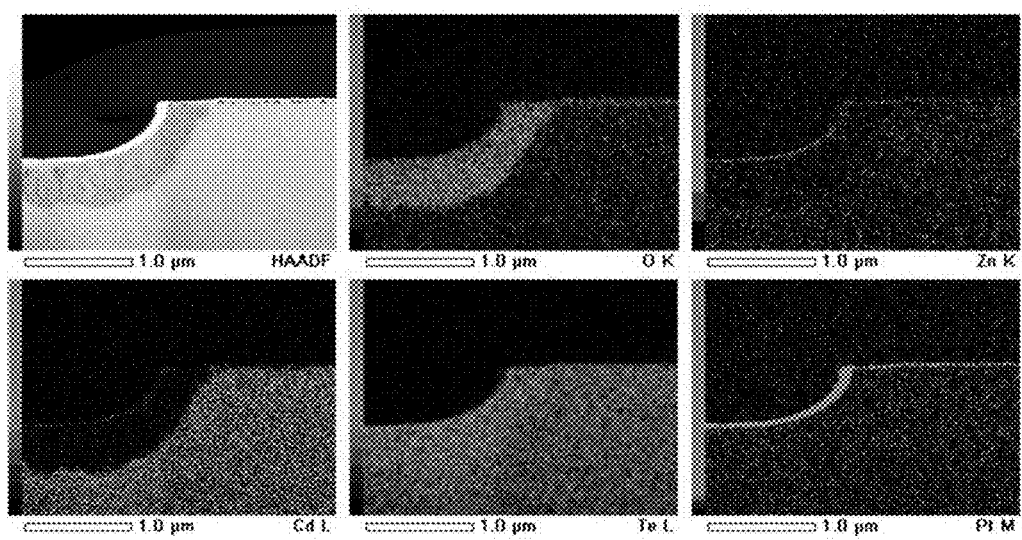
FIG. 5 is a result of component analysis by EDS in Example 1.

Further, the convex portion which was present to be adjacent to the concave portion in which the electrode portion is formed in the enlarged view corresponds to the insulating portion between the electrode portions. Similarly, the formation of the Pt electrode layer via the intermediate layer containing Te oxide can also be confirmed on the side wall portion of the insulating portion which is the convex portion. The Te oxide in the insulating portion (upper portion) under the resist film would have a part where the oxide is not present as a thickness that can be identified from the STEM image (about 0 nm), or would be about 20 nm as the maximum thickness. FIG. 5 shows results of analyzing a cross-sectional image of component analysis by EDS (Energy-Dispersive-Spectroscopy) provided in the STEM device. In FIG. 5, the HAADF-STEM (High-angle Annular Dark Field Scanning TEM) image on upper left is an image obtained by applying a finely focused electron beam to a sample while scanning it, and detecting a transmitted electron scattered at a high angle among transmitted electrons by an annular detector. It provides a contrast image due to a difference of atomic number, so that contrast of a composition can be seen. According to the results of the component analysis in FIG. 5, it can be confirmed from the distribution of oxygen (O) and tellurium (Te) in the cross-sectional direction of the substrate that the intermediate layer containing the Te oxide is formed between the concave portion of the CdZnTe substrate and the Pt electrode layer, and it is observed that the thickness of the Te oxide layer is about 480 nm. On the other hand, it is observed that the oxide on the upper portion of the convex insulating portion is formed to have a thickness of about 30 nm. From the STEM image and the results of the component analysis by EDS it is considered that the oxide having the maximum thickness of 30 nm is formed on the upper portion of the insulating portion. However, based on the STEM image and the distribution of the oxygen component by EDS, the oxide layers are not continuous in a layered shape, but the oxide layer is formed in an island shape, and any layer structure having lower insulating properties which would cause generation of leakage current was not observed. It has been found that when the thickness of the intermediate layer containing the Te oxide between the concave portion of the CdZnTe substrate and the Pt electrode layer is 100 nm or more, it is effective for preventing separation of the Pt electrode portion and the CdZnTe substrate.

In addition, although as the STEM images like island-shaped structures, the island-shaped portions each having a higher contrast than the Te oxide layer are seen in both Example (FIG. 4) and Comparative Example (FIG. 6), those island-shaped portions would not be the oxide, but an organic matter remaining after separating the resist.

Further, the above element was subjected to a voltage application test. The test was conducted by placing the element in a dark room that was not affected by electromagnetic waves such as radiation, and measuring values of current flowing when probe terminals were brought into contact with the electrode portions adjacent to each other across the insulating portion to apply a high voltage of 900V. As a result, a value of leakage current flowing between the electrode portions of the element disposed in the dark room was extremely low, which was a good result.

Comparative Example 1

An element was produced in the same method as that of Example 1 (however, the electroless plating time was 10 minutes), with the exception that before applying a resist film to the substrate, the resist film was immersed in an etching solution comprised of 300 ml of hydrobromic acid (HBr), 6 ml of bromine (Br), and 300 ml of water to perform etching, and the defected portion (crystal strain) remaining on the substrate surface was removed.

Figure 6:
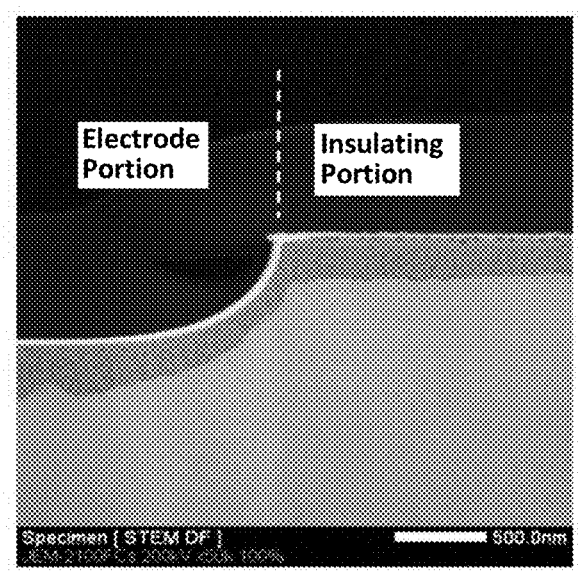
FIG. 6 is an enlarged cross-sectional image of a radiation detection element of Comparative Example 1.
Figure 7:
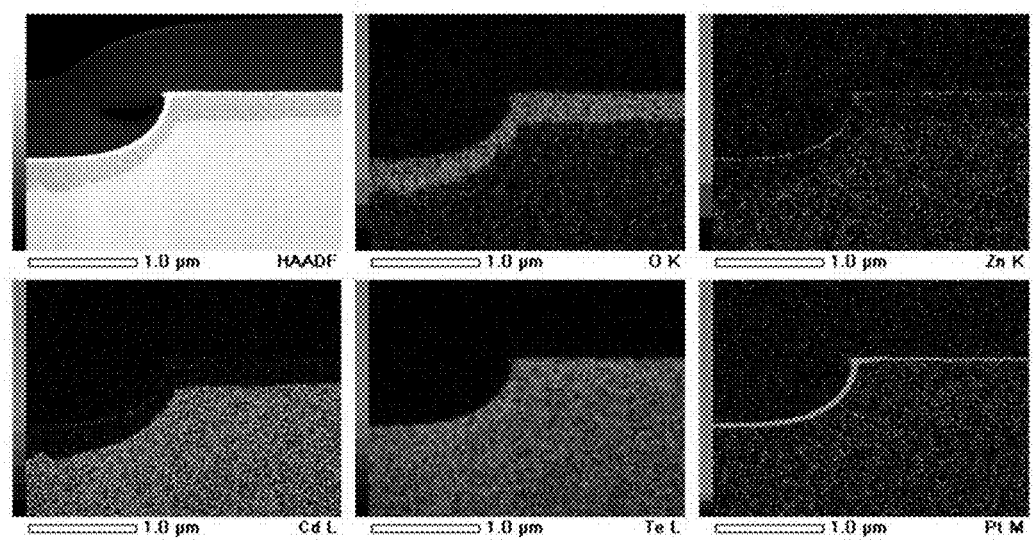
FIG. 7 is a result of component analysis by EDS in Comparative Example 1.

Further, for the resulting element, a cross-sectional structure of the element was observed in the same method as that of Example 1. FIG. 6 shows an enlarged cross-sectional image by STEM of the element obtained in this example. FIG. 7 shows results of component analysis by EDS provided in the STEM device. As with Example 1, the intermediate layer containing the Te oxide was formed between the surface of the CdZnTe substrate and the Pt electrode layer in the concave electrode portions. The thicknesses of the intermediate layer containing the Te oxide and the Pt electrode layer in this example were from 250 to 320 nm and from 30 to 50 nm, respectively.

Furthermore, a Te oxide layer having a thickness of 250 to 300 nm was formed on the convex upper portion of the insulating portion between the electrode portions. Moreover, the voltage application test was conducted in the same method as that of Example 1, and as a result, significantly larger leakage current between the electrode portions than that of Example was observed.

These results are summarized in Table 1.

structure of a radiation detector. This can lead to facilitation of a decreased area and increased density of the electrode portion in the radiation detecting element, i.e., an increased resolution and increased definition of the pixel, and can expect significant contributions to techniques such as various types of image analysis and image diagnosis as well as industrial equipment utilizing drawn images obtained by the radiation detecting element, such as X-ray photographs and X-ray CTs, and to industrial fields using them.

DESCRIPTION OF REFERENCE NUMERALS 100 radiation detecting element
101 electrode portion
200 substrate
201 insulating portion
202 electrode portion
203 intermediate layer
204 Te oxide
301 substrate
302 resist film
303 photomask
304 plated film

The invention claimed is:

1. A radiation detecting element, comprising: a plurality of electrode portions; and an insulating portion provided between the electrode portions on a surface of a substrate made of a compound semiconductor crystal containing cadmium telluride or cadmium zinc telluride,
    wherein an intermediate layer consisting of tellurium oxide is present between each of the electrode portions and the substrate,
    wherein tellurium oxide is present on an upper portion of the insulating portion, and the tellurium oxide on the upper portion of the insulating portion has a maximum thickness of 30 nm or less,
    wherein the intermediate layer has an average thickness of 100 nm or more, and
    wherein the tellurium oxide on the upper portion of the insulating portion is present in an island shape.

2. The radiation detecting element according to claim 1, wherein the tellurium oxide on the upper portion of the insulating portion has a maximum thickness of 20 nm or less.

3. The radiation detecting element according to claim 2, wherein the maximum thickness of the tellurium oxide on the upper portion of the insulating portion is 10 nm or less.

TABLE 1

|  | Etching before Applying Resist | Plating Time (min) | Electrode Portions | | Upper Portion of Insulating Portion | | Leakage Current | Separation of Electrode Portions |
|---|---|---|---|---|---|---|---|---|
|  |  |  | Thickness of Pt Plated Film Layer (nm) | Thickness of Te Oxide Layer (nm) | Thickness of Pt Plated Film Layer (nn) | Thickness of Te Oxide Layer (nm) |  |  |
| Example 1 | Absent | 10 | 40-80 | 400 | ≈0 | 10 or less | Slight | Absent |
| Comparative Example 1 | Present | 10 | 40 | 120 | 30 | 120 | Present | Absent |

According to the present disclosure, it is possible to ensure insulating properties between electrode portions even if a distance between the electrode portions is reduced and to prevent leakage current from being generated between the electrode portions, in a radiation detection element using a photoelectric effect of a CdTe-based crystal used as a main 4. The radiation detecting element according to claim 1, wherein the average thickness of the intermediate layer is 200 nm or more.

5. The radiation detecting element according to claim 4, wherein the average thickness of the intermediate layer is 400 nm or more.

6. The radiation detecting element according to claim 1, wherein the insulating portion provided between the electrode portions has a width of 100 μm or less.

7. The radiation detecting element according to claim 1, wherein the insulating portion provided between the electrode portions is the compound semiconductor crystal containing cadmium telluride or cadmium zinc telluride.

8. The radiation detecting element according to claim 1, wherein the electrode portions are formed of a thin film containing platinum, gold, or an alloy containing at least one of platinum and gold.

9. The radiation detection element according to claim 1, wherein in a cross section perpendicular to the surface of the substrate, each of the electrode portions has a concave shape, and the insulating portion provided between the electrode portions has a convex shape.

10. The radiation detecting element according to claim 1, wherein when the compound semiconductor crystal is a cadmium zinc telluride crystal ($Cd_{1-x}Zn_x$ Te), it is a cadmium zinc telluride crystal having a concentration x of zinc in a Group II element of 2 at % or more and 10 at % or less.

11. The radiation detecting element according to claim 1, wherein the surface of the substrate made of the compound semiconductor crystal has an orientation plane which is {111}, {110}, or {100}.

12. A method for producing the radiation detecting element according to claim 1, the method comprising the steps of:
- processing a substrate into a wafer shape by cutting out the substrate from a compound semiconductor crystal ingot containing cadmium telluride or zinc cadmium telluride, polishing and washing it;
- forming a resist film patterned into a predetermined shape on a surface of the wafer-shaped substrate, the resist film being formed in a region other than regions where the electrode portions are to be formed;
- etching the regions where the electrode portions are to be formed; and
- forming electrode portions on the surface of the substrate in the region where the electrode portions are to be formed, by immersing the etched substrate in an electroless plating solution.

\* \* \* \* \*